United States Patent [19]

Katsuki et al.

[11] Patent Number: 5,728,276
[45] Date of Patent: Mar. 17, 1998

[54] TREATMENT APPARATUS

[75] Inventors: Jiro Katsuki; Yuichi Wada; Hiroshi Kobayashi, all of Yamanashi-Ken, Japan

[73] Assignee: Tel Varian Limited, Yamanashi-ken, Japan

[21] Appl. No.: 517,566

[22] Filed: Aug. 21, 1995

[30] Foreign Application Priority Data

Aug. 23, 1994 [JP] Japan .................................. 6-222451

[51] Int. Cl.⁶ .................................................. C23C 14/34
[52] U.S. Cl. ........................... 204/298.11; 204/298.06; 204/298.08; 204/298.14; 204/298.19; 204/192.12
[58] Field of Search ................. 204/298.06, 298.08, 204/298.11, 298.14, 298.16, 298.19, 192.12

[56] References Cited

U.S. PATENT DOCUMENTS

| | | | |
|---|---|---|---|
| 3,669,860 | 6/1972 | Knowles et al. | 204/192.12 |
| 4,006,073 | 2/1977 | Welch | 204/298.06 |
| 4,824,544 | 4/1989 | Mikalesen et al. | 204/298.06 |
| 4,963,239 | 10/1990 | Shimamura et al. | 204/298.06 |
| 5,114,556 | 5/1992 | Lamont, Jr. | 204/298.11 |
| 5,133,849 | 7/1992 | Kinoshita | 204/298.05 |
| 5,403,459 | 4/1995 | Guo | 204/298.11 |

FOREIGN PATENT DOCUMENTS

5-311419  11/1993  Japan .................. 204/298.11

*Primary Examiner*—Nam Nguyen
*Assistant Examiner*—Rodney G. McDonald
*Attorney, Agent, or Firm*—Beveridge, Degrandi, Weilacher & Young, LLP

[57] ABSTRACT

In a treatment apparatus, a collimator is insulated electrically from the other equipment to be rendered electrically floating, and also the potential of the collimator is variably controllable by a variable DC power source. Therefore, the thickness in plane of the layer to be produced can be uniformalized by controlling the voltage applied to the collimator, without changing both layout and figure of the hardware, e.g., permanent magnet, without process, and further without both beginning and end of a target.

18 Claims, 7 Drawing Sheets

GROUND COLLIMATOR (±0V)

FIG. 6B

FLOATING COLLIMATOR (-30V)

FIG. 6C

DC BIAS COLLIMATOR (+10V)

TREATMENT APPARATUS

BACKGROUND OF THE INVENTION

1. Field of the Invention

The present invention relates to a treatment apparatus, and more particularly, to a sputtering apparatus for depositing sputtering particles on an object to be treated.

2. Information of the Related Art

Conventionally, a sputtering apparatus is used in semiconductor manufacturing processes. In order to form interval wiring or wire electrodes, in this sputtering apparatus, an object to be treated, such as a semiconductor wafer, and a target, which is formed of a desired film material, are arranged opposite to each other in a treatment chamber in a predetermined decompressed atmosphere, and sputtering particles from the target are deposited on the to-be-treated object.

With the development of high-integration versions of semiconductor devices, there has been a demand for the establishment of an accurate technique for finer machining in semiconductor manufacturing processes. In a process for forming internal wiring by using a sputtering apparatus, for example, it is necessary to embed contact holes with small diameter and depth, that is, with a high aspect ratio, by means of sputtering particles. Generally, however, the sputtering process is low in step coverage. As the aspect ratio of apertures increases, therefore, disconnection is caused more easily at the bottom of the apertures.

Figure 8:
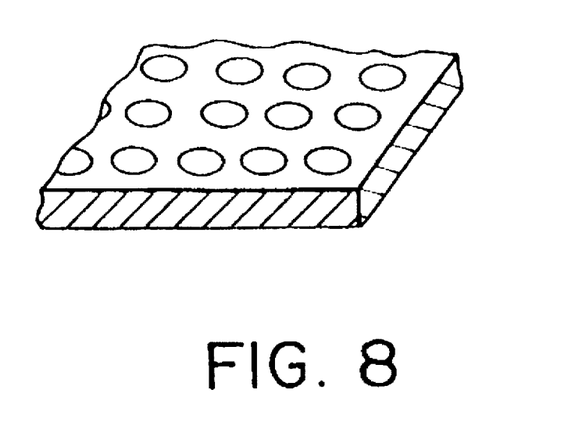
FIG. 8 is a perspective view showing part of a conventional collimator.
Figure 9:
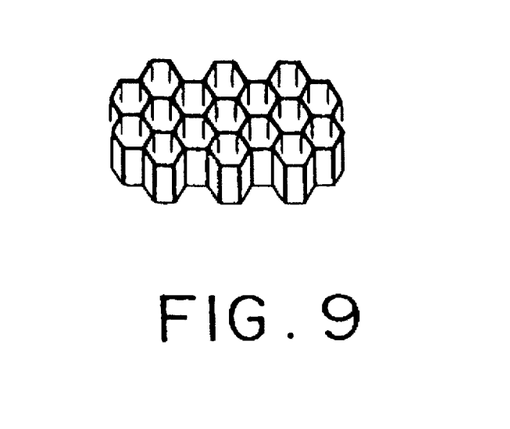
FIG. 9 is a perspective view showing part of another conventional collimator.

In the latest sputtering apparatuses, therefore, a collimator, which is formed by boring a plurality of circular of honeycomb-shaped pores in a metallic plate, such as a stainless steel plate, or an insulating plate of ceramics or the like, as shown in FIG. 8 and 9, is interposed between a target and an object to be treated. The direction of radiation of sputtering particles generated in a cosine curve σ from the target is regulated by means of the collimator, and only those components which are substantially vertically incident upon the treatment surface of the to-be-treated object are selected. By doing this, the step coverage of the sputtering process is improved. With use of the collimator designed in this manner, the step coverage can be increased to a degree about three times as high as that of the conventional sputtering process, in the case of contact holes whose necessary aspect ratio for the manufacture of a 64-MDRAM is not higher than 3.0.

Figure 3:
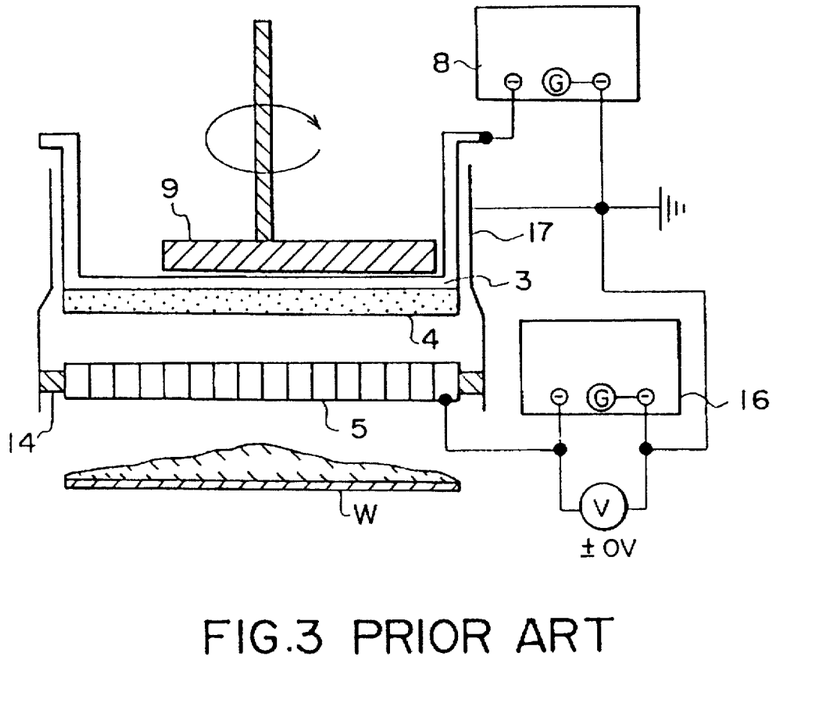
FIG. 3 is a diagram for illustrating the operation of the apparatus, according to prior art, in which ground potential is applied to the collimator.
Figure 6A:
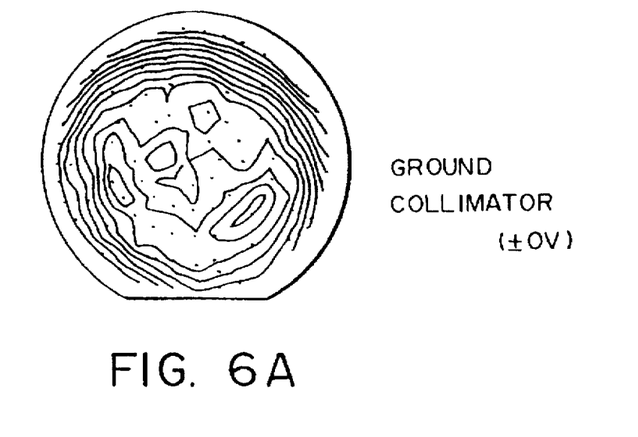
FIGS. 6A, 6B and 6C are plan views schematically showing layer thicknesses obtained in the processes shown in FIGS. 3, 4 and 5, respectively.

In one such conventional sputtering apparatus, as shown in FIG. 3, sputtering particles produced by sputtering by means of a target 4 are directed to a collimator 5 or a to-be-treated object W by dropping the potential of the collimator 5 and/or a shield 17, compared with a cathode 3 and/or the target 4 to which a DC voltage of about –400 to –700 V is applied, to the ground level. According to this arrangement, however, the layer thickness is subject to a variation such that it is greater in the central portion than in the peripheral portion, as shown in FIGS. 3 and 6A, for example. Thus, the layer thickness in the plane of the to-be-treated object cannot be uniformalized.

Thereupon, the in-plane layer thickness is uniformalized by adjusting the arrangement and/or configuration of a magnet, such as a permanent magnet 9, which is arranged on the rear side of the cathode 3 and/or the target 4. However, the optimum arrangement and/or configuration of the magnet varies depending on the process. In uniformalizing the in-plane layer thickness by means of the magnet, therefore, it is necessary to obtain the optimum arrangement and/or configuration of the magnet for each process experimentally or by calculation, and to design, manufacture, and set the magnet. These operations are very troublesome and take much time and labor, so that this conventional method cannot be applied to a practical production line.

It is generally know, moreover, that the uniformity of the layer thickness substantially varies depending on the target layer thickness stage in one process. The variation of the layer thickness cannot, however, be adjusted by the aforesaid method in which the magnet is used to ensure the in-plane uniformity of the layer thickness.

SUMMARY OF THE INVENTION

The object of the present invention is to provide a novel improved treatment apparatus in which the in-plane layer thickness can be uniformalized more easily without changing the hardware design or replacing hardware with every process.

In order to achieve the above object, according to the present invention, there is provided a treatment apparatus for depositing sputtering particles on an object to be treated which is arranged in a treatment chamber, comprising:

a target arranged opposite to the object in the treatment chamber;

a collimator for regulating the flying direction of sputtering particles produced by sputtering from the target; and insulating means for insulating the collimator from other equipment.

In the conventional sputtering apparatus, the collimator kept at ground potential serves as a kind of a pole opposite to the target, so that the layer thickness tends to be greater in the central portion of the to-be-treated object than in the peripheral portion. In the treatment apparatus according to the invention, however, the collimator is insulated electrically from the other equipment to be rendered electrically floating. Therefore, the collimator does not serve as an opposite pole, so that the sputtering particles disperse to the peripheral portion without being centralized, thus enabling uniformalization of the layer thickness.

Preferably, the potential of the collimator is variably controllable, the potential of the collimator in the electrically floating state, compared with the target potential, for example, can be biased more positively by controlling the collimator potential, so that layer thickness of the to-be-treated object can be controlled variably.

Preferably, moreover, the collimator is formed of a plurality of blocks insulated electrically from one another, the potential of each block being variably controllable. By controlling the potential of each block of the divided collimator, moreover, the variation of the layer thickness of the to-be-treated object can be controlled in blocks, so that the in-plane layer thickness of the to-be-treated object can be uniformalized easily.

Preferably, furthermore, the collimator is formed of a plurality of concentric blocks insulated electrically from one another, the potential of each block being variably controllable. In processing a discoid semiconductor wafer, for example, concentric variation of the layer thickness can be compensated by controlling the potential of each of the concentric blocks of the collimator.

Preferably, the present invention is applied to a magnetron-type treatment apparatus designed so that magnetic fields in a treatment chamber are regulated by magnet means. By using the aforementioned collimator in the magnetron-type treatment apparatus, the operation of the treatment apparatus can be complemented, and the layer thickness can be uniformalized without regard to the process.

DETAILED DESCRIPTION OF THE PREFERRED EMBODIMENTS

Preferred embodiments of the present invention will become understood from the following detailed description referring to the accompanying drawings. The following is a detailed description of a magnetron-type sputtering apparatus as a treatment apparatus according to one embodiment of the present invention.

Figure 1:
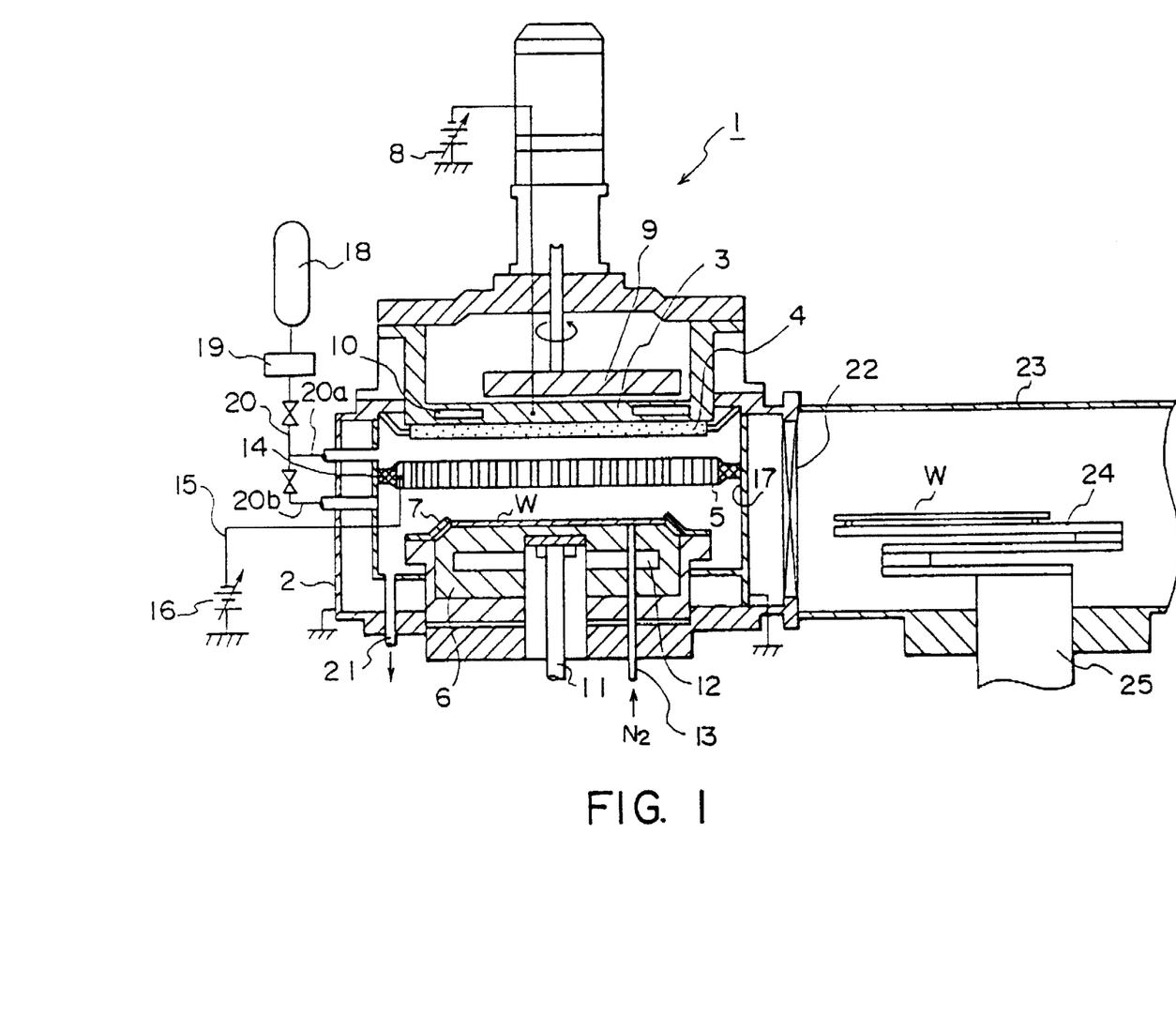
FIG. 1 is a schematic sectional view of a sputtering apparatus of the DC magnetron type according to one embodiment of the present invention.

As shown in FIG. 1, the sputtering apparatus 1 is provided with a barrel-shaped treatment container 2 formed of stainless steel or aluminum. In the treatment container 2, a cathode 3, target 4, collimator 5, and anode 6 are arranged successively from top to bottom so as to face one another. The anode 6 doubles as a carrier for fixedly carrying an object W to be treated, and is designed so that the to-be-treated object W, such as a semiconductor wafer, can be fixedly mounted on its bearing surface by means of a chuck 7.

The cathode 3, which is formed of an electrically conductive metal, is connected with a variable DC high-voltage power source 8. In sputtering operation, glow discharge is caused between the cathode 3 and the anode or carrier 6 by applying DC power of, e.g., 10 to 20 kW. By doing this, ion particles are caused to run against the target 4, which is bonded to the lower surface of the cathode 3, so that repelled sputtering particles can be deposited on the treatment surface of the to-be-treated object W which is placed in a position opposite to the target 4. A rotatable permanent magnet 9 is located over the cathode 3. The magnet 9 can form rectangular electromagnetic fields in the vicinity of the cathode 3, thereby trapping secondary ions to accelerate ionization. The variation of the thickness of the to-be-treated object W can be regulated by adjusting the arrangement and/or configuration of the permanent magnet 9. A cooling jacket 10 is contained in the cathode 3 so that rises in temperature of the cathode 3 and/or the target 4 can be restrained by circulating a refrigerant, such as cooling water, in the jacket 10.

Located at the lower part of the treatment container 2 is the carrier 6 which is formed of an electrically conductive metal, such as stainless steel, and doubles as the anode. The carrier 6 is substantially cylindrical in shape, and can be raised and lowered by means of a lift mechanism 11. Also, the carrier 6 contains a heating unit 12, such as a heater, which can heat the to-be-treated object W to a desired temperature, e.g., 200° C. Argon gas or the like can be supplied to the inside of the to-be-treated object through a pipe 13, whereby the efficiency of heat transfer from the heating unit 12 is improved.

The collimator 5 is located between the target 4 and the carrier 6. As shown in FIG. 8 or 9, the collimator 5 is formed by boring a large number of honeycomb-shaped or circular pores in a disk of an electrically conductive metal, such as stainless steel. An insulating member 14 (insulating means) of e.g. ceramics is attached to the periphery of the collimator 5 so that the collimator is insulated electrically from the inner wall of the treatment container 2, a shield 17, etc. Thus, the collimator 5 can be kept in an electrically floating state during processing. Further, the collimator 5 is connected with a variable DC power source 16 by means of a voltage supply lead wire 15 so that it can be supplied with a desired potential whereby the in-plane layer thickness of the to-be-treated object can be uniformalized, as mentioned later.

In the treatment container 2, moreover, the shield 17 of e.g. stainless steel is formed surrounding a space in which the sputtering particles fly from the cathode 3 to the anode (carrier) 6. Thus, the inner wall of the treatment container 2 is protected against the sputtering particles. The potential of the shield 17 is dropped to the ground level by earthing, and the shield serves also as a kind of an opposite electrode at the time of processing.

Furthermore, the treatment container 2 is connected with a treatment gas inlet pipe 20 through which a desired treatment gas is supplied from a gas source 18 via a mass-flow controller 19. Thus, the treatment gas may be an inert gas, such as argon, which can be introduced into the treatment container 2 through a first pipe 20a, or a reactive gas, such as nitrogen, which can be introduced through a second pipe 20b. An exhaust port 21 is provided at the bottom portion of the treatment container 2 so that the container 2 can be evacuated to a desired pressure by means of a vacuum pump, e.g., a cryo-pump (not shown).

Figure 2:
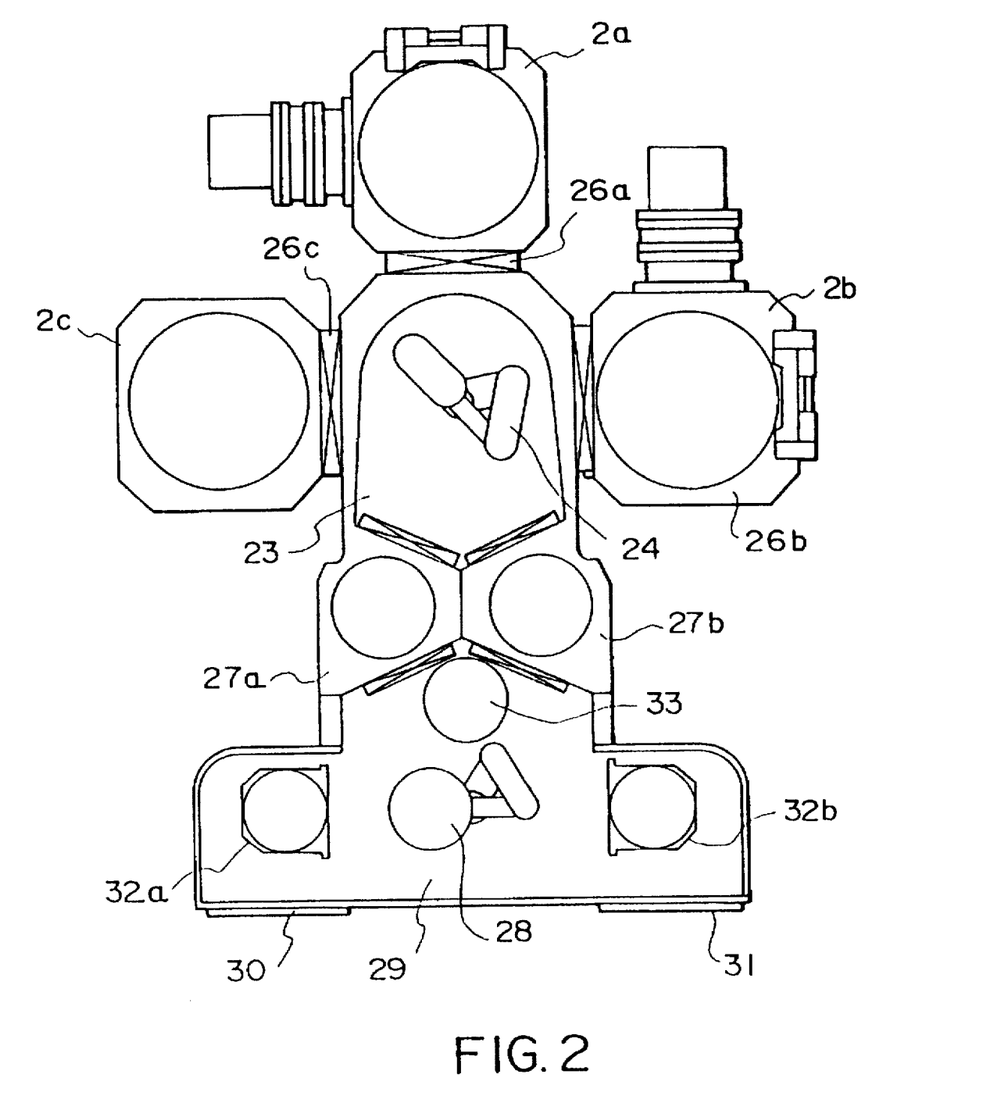
FIG. 2 is a schematic view of a multi-chamber semiconductor manufacturing apparatus furnished with the sputtering apparatus shown in FIG. 1.

A transfer chamber 23 is attached to one side face of the treatment container 2 by means of a gate valve 22, and a transportation mechanism 25 having a transportation arm 24 is set in the chamber 23. As shown is FIG. 2, moreover, the transfer chamber 23 are connected with a plurality of treatment containers 2a, 2b and 2c by means of gate valves 26a, 26b and 26c, respectively, so as to be surrounded thereby. The treatment containers 2a, 2b and 2c are used to carry out various treatments, such as sputtering, etching, etc., for the to-be-treated object. These elements constitute a multi-chamber semiconductor manufacturing apparatus. A loader/unloader chamber 29 having a transportation arm 28 is connected to one side face of the transfer chamber 23 by means of preliminary vacuum chambers 27a and 27b. The chamber 29 is provided with a loader port 30 and an unloader port 31 through which wafer cassettes 32a and 32b, each stored with a predetermined number of (e.g., 25)

to-be-treated objects, can be loaded into and unloaded from the chamber 29, respectively.

The following is a brief description of the operation of the multi-chamber semiconductor manufacturing apparatus which is furnished with the DC magnetron-type sputtering apparatus according to the one embodiment of the present invention.

First, a specific semiconductor wafer W is taken out of the cassette 32a in the loader/unloader chamber 29 by means of the transportation arm 28, positioned according to its orientation flat by means of a positioning device 33, and carried into the preliminary vacuum chamber 27a. Then, the transportation arm 24 of the transfer chamber 23 receives the wafer W, carries it into the treatment container 2a for etching, for example. Thereupon, a predetermined through hole is etched in an interlayer insulating layer which is formed of, e.g., silicon oxide.

After the etching process is finished, the transportation arm 24 carries out the wafer W, carries it into the treatment container 2b for sputtering, and places it on the carrier 6, whereupon the wafer W is fixed by means of the chuck 7. Then, the treatment container 2b is evacuated to, e.g., $10^{-2}$ to $10^{-3}$ Torr as argon gas is introduced into the container 2b through the gas inlet pipe 20a. After the wafer W is heated to a desired temperature of e.g. 200° C. by means of the heater 12, a DC high-voltage power of 10 to 20 kW is applied to the cathode 3. Thereupon, glow discharge is caused between the cathode 3 and the anode 6. By doing this, ion particles can be caused to run against the target 4 of titanium, which is bonded to the lower surface of the cathode 3, and repelled titanium particles can be deposited on the treatment surface of the wafer W which is placed in the position opposite to the target 4. Also, the rectangular electromagnetic fields, which are formed in the vicinity of the cathode 3 by the permanent magnet 9 overlying the cathode 3, trap secondary ions to accelerate ionization. Furthermore, the rises in temperature of the cathode 3 and/or the target 4 are restrained by circulating the refrigerant, such as cooling water, in the cooling jacket 10 which is contained in the cathode 3.

As the titanium particles repelled by the target 4 pass through the collimator 5 whose potential is optimized, only their substantially vertical components are selected, and their distribution on a substantially horizontal plane is uniformlized. Thus, an ohmic contact layer with a satisfactory step coverage is formed such that the through hole in the interlayer insulating layer is uniformly filled to a predetermined thickness so that the in-place thickness is uniform. Then, a titanium nitride layer is formed as a barrier on the titanium layer. In doing this, nitrogen gas is introduced through the gas inlet pipe 20b so that titanium is nitrified in the vicinity of the wafer W, and the titanium nitride with a uniform in-plane layer thickness is deposited on the titanium layer by sputtering. After a series of sputtering processes is finished in this manner, the wafer W is carried out again by means of the transportation arm 24. Thereafter, the wafer W is carried into the treatment container 2c for CVD, and a tungsten layer is formed on the titanium nitride layer by the CVD method, whereupon a junction hole is completed such that the through hole is inlaid with a wiring material formed of tungsten.

After a series of treatments is finished, the wafer W is carried out again by means of the transportation arm 24 of the transfer chamber 23, returned to the preliminary vacuum chamber 27b, and then delivered to the transportation arm 28 of the loader/unloader chamber 29. Thereafter, the wafer W is received by the cassette 32b and carried out of the apparatus through the unloader port 31, whereupon a series of processes is completed.

Figure 4:
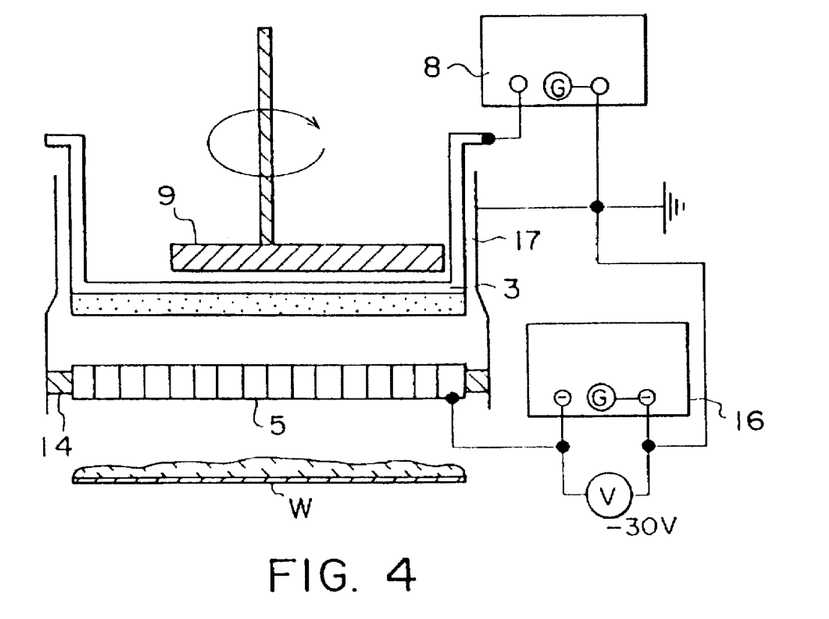
FIG. 4 is a diagram for illustrating the operation of the apparatus of the invention, in which floating potential is applied to the collimator.
Figure 5:
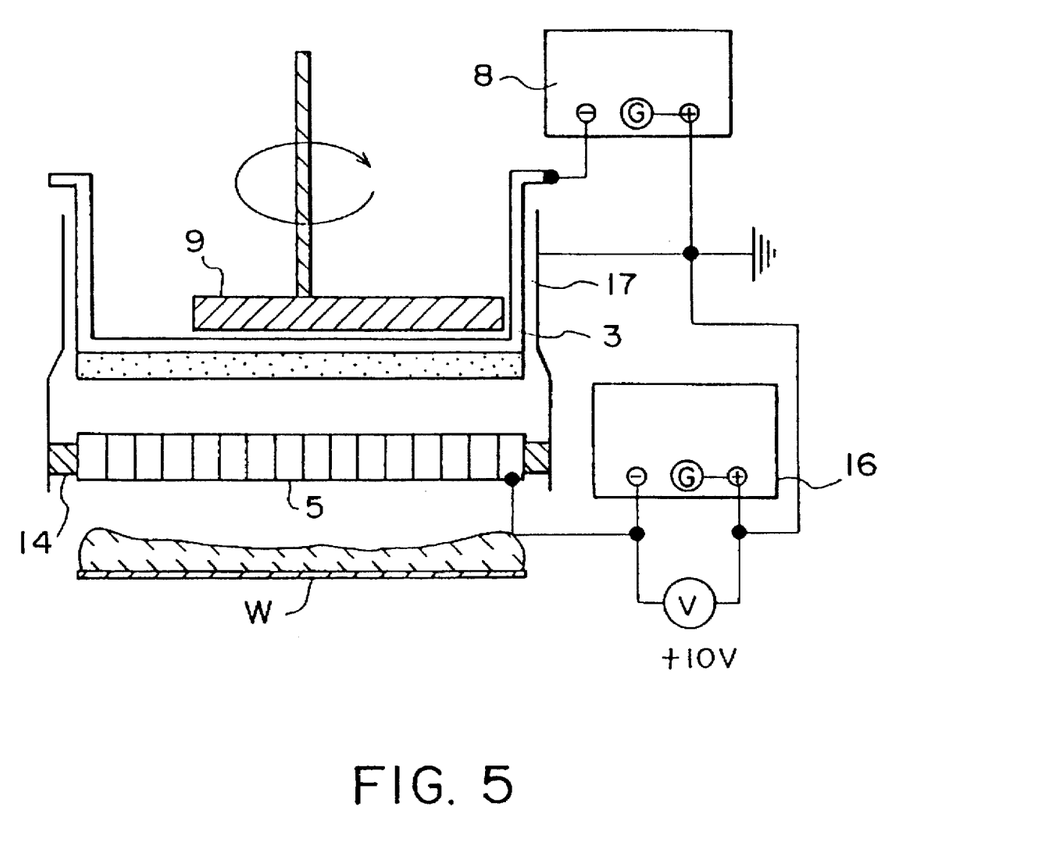
FIG. 5 is a diagram for illustrating the operation of the apparatus of the invention, in which bias potential is applied to the collimator.

Referring now to FIGS. 3 to 6, prominent effects of the treatment apparatus according to the present invention will be described in comparison with the results of treatment obtained with use of a conventional treatment apparatus. FIGS. 3 to 5 are diagrams schematically showing only essential components of the apparatus shown in FIG. 1. In these drawings, therefore, like reference numerals are used to designate like components with the same functions, and a description of those components will not be repeated.

Figure 6B:
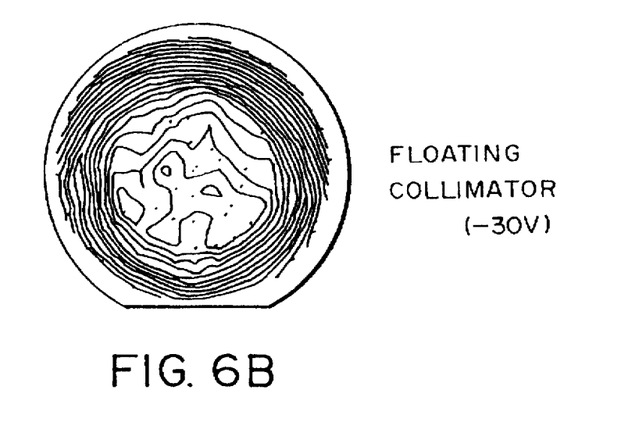
Figure 6C:
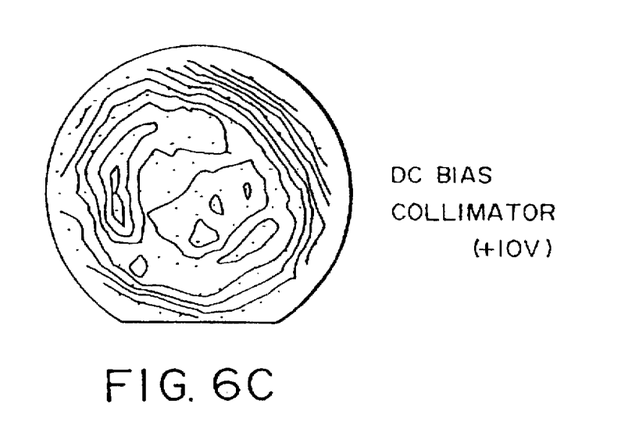

In the arrangement shown in FIG. 3, the collimator 5 is not insulated from other equipment, and a voltage of ±0 V from the variable DC power source 16 is applied to the collimator to reproduce a state such that the collimator is grounded through the shield 17. In the arrangement shown in FIG. 4, which is based on the present invention, the collimator 5 is insulated electrically from the other equipment, and a voltage of −30 V is applied to the collimator to reproduce a state such that the collimator is floating. In the arrangement shown in FIG. 5, which is also based on the present invention, the collimator 5 is insulated electrically from the other equipment, and a voltage of +10 V is applied to the collimator to reproduce a state such that the collimator has bias potential. In any of these cases, a DC voltage of −400 to −700 V is supposed to be applied to the cathode 3. FIGS. 6A, 6B and 6C shows results of measurement of layer thicknesses obtained in the processes shown in FIGS. 3, 4 and 5, respectively, on the basis of the sheet resistance.

In the conventional apparatus, as seen from the above results, the collimator, in association with the cathode, tends to form a layer whose thickness is greater in the central portion than in the peripheral portion (FIGS. 3 and 6A). According to the present invention, however, the variation of the layer thickness can be compensated by insulating the collimator from the other equipment to render it floating (FIGS. 4 and 6B). According to the invention, moreover, the collimator may be insulated from the other equipment and supplied with bias potential so that the layer thickness is greater in the peripheral portion than in the central portion, in contrast with the case of the grounded state shown in FIG. 3. Thus, according to the invention, the layer thickness can be uniformalized, without regard to the process or the stage of collimation, by controlling the potential applied to the collimator without adjusting or changing the hardware conditions, such as the arrangement and configuration of the permanent magnet.

Figure 7:
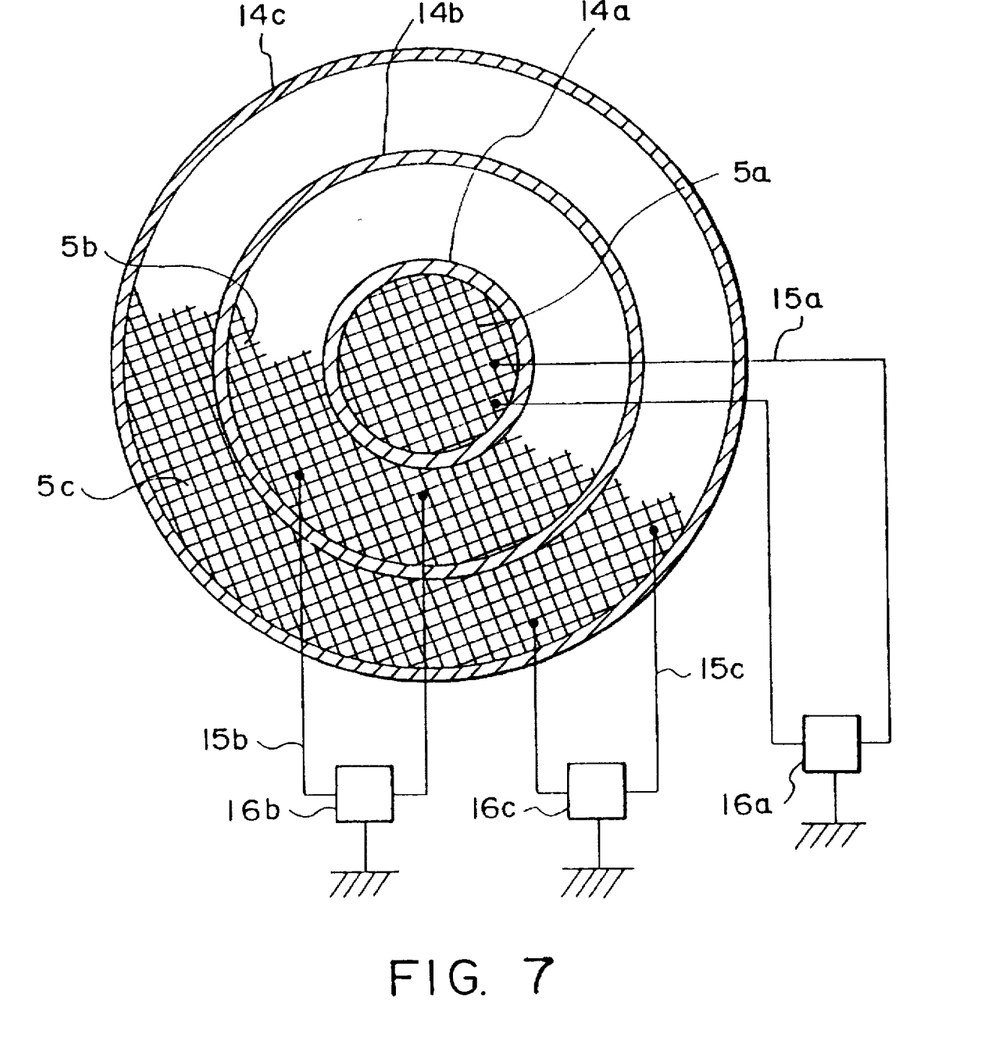
FIG. 7 is a schematic plan view showing an alternative embodiment of the collimator which can be mounted in a treatment apparatus according to the invention.

FIG. 7 shows a treatment apparatus according to another embodiment of the present invention. In the present embodiment, a collimator 5 is formed of three concentric blocks 5a, 5b and 5c, which are insulated from one another by means of insulating members 14a, 14b and 14c. The blocks 5a, 5b and 5c are connected with variable DC power sources 16a, 16b and 16c, which can be controlled independently of one another, by means of voltage supply lead wires 15a, 15b and 15c, respectively. With this arrangement, the variation of the layer thickness can be compensated more finely by applying bias potential to those blocks which tend to increase the layer thickness or by some other control. In the embodiment shown in FIG. 7, in particular, concentric variation of the layer thickness, which is caused when a discoid semiconductor wafer W is processed, can be compensated effectively by concentrically dividing the blocks.

Although the collimator is divided into concentric blocks in the embodiment shown in FIG. 7, the present invention is not limited to this embodiment, and the collimator may be divided into blocks of any other desired shapes. In the embodiment shown in FIG. 7, moreover, the collimator is divided into three parts. Alternatively, however, the collimator may be divided into any other desired number of blocks.

Although the DC magnetron-type sputtering apparatuses have been described as apparatuses according to the present invention in connection with the embodiments herein, the invention is not limited those embodiments. Naturally, the invention may be also applied to various other sputtering apparatuses, such as a high-frequency sputtering apparatus, opposite-target sputtering apparatus, ECR sputtering apparatus, bias sputtering apparatus, etc. Moreover, the present invention is not limited to the sputtering apparatuses, and may be applied to any other treatment apparatuses which are provided with a collimator for restricting the flying direction of particles.

According to the present invention, as described above, the variation of the in-plane layer thickness of the to-be-treated object can be easily compensated by only controlling the potential of the collimator without regard to the process or the target stage and without changing the hardware such as the permanent magnet. Thus, the yield of products can be improved.

Since the collimator is insulated electrically from the other equipment to be rendered electrically floating, it does not serve as an opposite pole, so that the sputtering particles disperse to the peripheral portion without being centralized, thus enabling uniformalization of the layer thickness.

The variation of the layer thickness of the collimator can be uniformalized more accurately by controlling the potential of the collimator in the electrically floating state.

By controlling the potential of each block of the divided collimator, moreover, the variation of the layer thickness of the to-be-treated object can be controlled in blocks, so that the in-plane layer thickness of the to-be-treated object can be uniformalized further accurately and easily. In the case where the blocks are arranged concentrically, in particular, the concentric variation of the layer thickness can be compensated effectively.

The present invention may be applied to a magnetron-type treatment apparatus in which magnetic fields in a treatment chamber are regulated by magnet means to uniformalize the layer thickness. According to this arrangement, the operation of the treatment apparatus can be complemented, and the layer thickness can be uniformalized without changing the arrangement or shape of the permanent magnet and without regard to the process or the target stage.

While the presently preferred embodiments of the present invention have been shown and described, it is to be understood that this disclosure is for the purpose of illustration and that various changes and modifications may be made without departing from the scope of the invention as set forth in the appended claims.

What is claimed is:

1. A treatment apparatus for depositing sputtering particles on an object to be treated which is arranged in a treatment chamber, comprising:

a target support for supporting a target to be sputtered;

an object support for supporting an object to be treated by sputtering;

an anode and a cathode for together producing sputtering of particles from a target supported by the target support to an object supported by the object support;

a collimator interposed between the target support and the object support, for regulating the flying direction of sputtering particles from a target supported by the target support, the collimator including a plurality of blocks electrically insulated from each other;

insulating means for insulating the collimator from the anode and the cathode, such that the collimator is in an electrically floating state relative to the anode and the cathode; and controlling means for applying a variable potential to the collimator.

2. The treatment apparatus according to claim 1, wherein said insulating means includes an insulating member arranged so as to surround said collimator.

3. The treatment apparatus according to claim 1, wherein the controlling means applies a positive potential to the collimator.

4. The treatment apparatus according to claim 1, wherein the controlling means applies a separate variable potential to each block of the collimator.

5. The treatment apparatus according to claim 4, wherein said controlling means applies a separate positive variable potential to each block of the collimator.

6. The treatment apparatus according to claim 1, wherein said plurality of blocks are concentrically arranged.

7. The treatment apparatus according to claim 1, wherein said treatment apparatus includes a magnetron for regulating magnetic fields in the treatment chamber.

8. The treatment apparatus according to claim 2, further including a shield member positioned within said treatment chamber and extending around said collimator, said insulating member having an annular shape and dimensioned so as to fill an annular gap formed between said shield and said collimator.

9. The treatment apparatus according to claim 8, wherein the shield is electrically grounded.

10. An apparatus as recited in claim 1, wherein the controlling means applies a DC potential to the collimator.

11. The treatment apparatus according to claim 1, further including potential means for applying a variable potential to the cathode.

12. An apparatus as recited in claim 11, wherein the potential means applies a DC potential to the cathode, and the controlling means applies a DC potential to the collimator.

13. An apparatus as recited in claim 12, wherein a DC potential of −400 to −700 V is applied to the cathode and a DC potential of −30 V is provided to said collimator.

14. An apparatus as recited in claim 11, wherein the controlling means applies a positive DC potential to the collimator.

15. An apparatus as recited in claim 14, wherein a DC potential of −400 to −700 V is applied to the cathode and a voltage of +10 V is applied to the collimator.

16. An apparatus as recited in claim 1, wherein the cathode forms the target support.

17. An apparatus as recited in claim 16, wherein the anode forms the object support.

18. An apparatus as recited in claim 1, wherein the anode forms the object support.

* * * * *

UNITED STATES PATENT AND TRADEMARK OFFICE
CERTIFICATE OF CORRECTION

PATENT NO. : 5,728,276
DATED : March 17, 1998
INVENTOR(S) : Jiro Katsuki et al.

It is certified that error appears in the above-indentified patent and that said Letters Patent is hereby corrected as shown below:

On the title page, item [73] Assignee, should read as follows:

Tokyo Electron Limited and
        Varian Japan K.K., both of
        Tokyo, Japan.

Signed and Sealed this

Fifteenth Day of February, 2000

Attest:

Q. TODD DICKINSON

*Attesting Officer*      *Commissioner of Patents and Trademarks*